United States Patent [19]

Sugita et al.

[11] Patent Number: 5,068,706
[45] Date of Patent: * Nov. 26, 1991

[54] SEMICONDUCTOR DEVICE WITH FUSE FUNCTION

[75] Inventors: Naomasa Sugita, Yokohama; Yoshiharu Yotumoto, Kimitsu; Kouji Moriguchi, Kimitsu; Toshinobu Sekiba, Kimitsu, all of Japan

[73] Assignee: Kabushiki Kaisha Toshiba, Kawasaki, Japan

[*] Notice: The portion of the term of this patent subsequent to Jul. 24, 2007 has been disclaimed.

[21] Appl. No.: 478,536

[22] Filed: Feb. 12, 1990

Related U.S. Application Data

[63] Continuation of Ser. No. 166,002, Mar. 9, 1988, Pat. No. 4,943,842.

[30] Foreign Application Priority Data

Mar. 11, 1987 [JP] Japan .................... 62-54098

[51] Int. Cl.$^5$ .................... H01L 27/02; H01L 23/48; H01L 23/16
[52] U.S. Cl. .................... 357/51; 357/71; 357/75; 357/81
[58] Field of Search .................... 357/51, 71, 75, 81

[56] References Cited

U.S. PATENT DOCUMENTS

| | | | |
|---|---|---|---|
| 3,340,430 | 9/1967 | Jenkins | 357/51 |
| 3,543,102 | 11/1970 | Dahlberg et al. | 357/51 |
| 4,091,353 | 5/1978 | Fisk et al. | 237/204 |
| 4,107,759 | 8/1978 | Shirn et al. | 357/51 |
| 4,547,830 | 10/1985 | Yamauchi | 357/51 |
| 4,869,972 | 9/1989 | Hatagishi | 357/51 |

Primary Examiner—J. Carroll
Attorney, Agent, or Firm—Finnegan, Henderson, Farabow, Garrett and Dunner

[57] ABSTRACT

A semiconductor device includes a radiation plate, first and second conductive patterns formed on one surface of the radiation plate, a first semiconductor element fixed on and connected to the first conductive pattern, a second semiconductor element fixed on and connected to the second conductive pattern, a conductive member for connecting the first and second semiconductor elements to each other, a first external terminal electrically connected to the first conductive pattern, a second external terminal electrically connected to the second conductive pattern, a third external terminal electrically connected to the conductive member, and an outer casing, which is filled with epoxy resin, for enclosing the semiconductor elements and the first to third external terminals. Part of each of the first to third external terminals is exposed to an exterior of the casing. At least one of the conductive member, first external terminal, second external terminal, and third external terminal includes a hollow fuse.

6 Claims, 11 Drawing Sheets

BEFORE FUSED

JUST FUSED
(CIRCUIT-BROKEN)

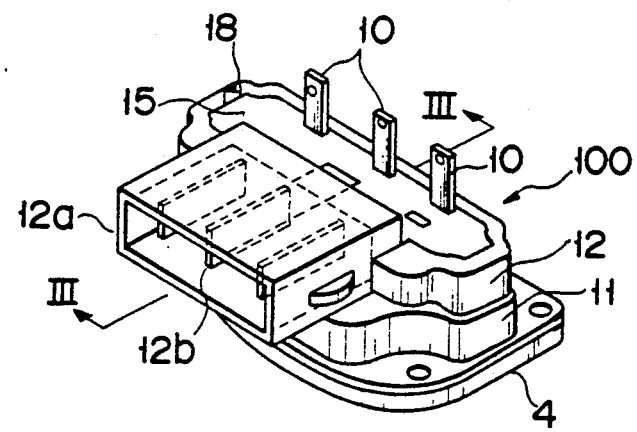
F I G. 1
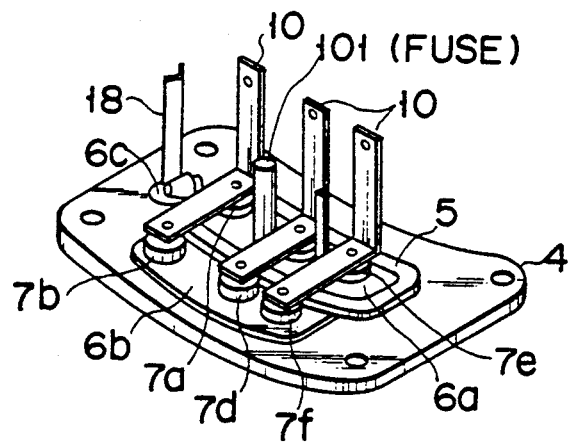
F I G. 2
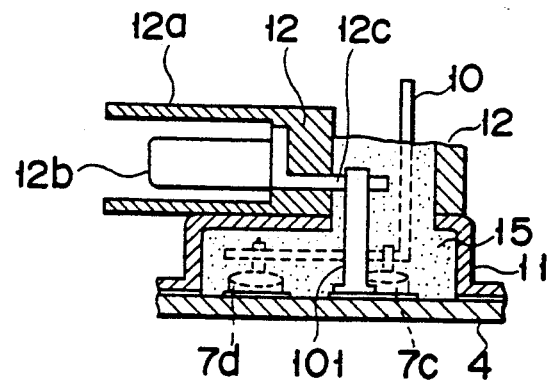
F I G. 3

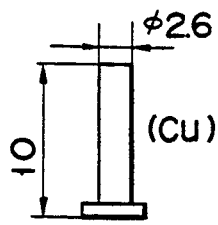
FIG. 4
(PRIOR ART)
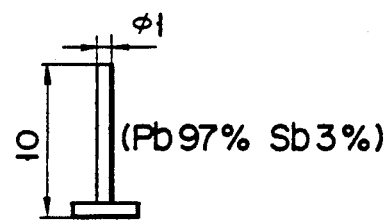
FIG. 5
(PRIOR ART)
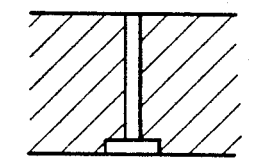
BEFORE FUSED
FIG. 6A
(PRIOR ART)
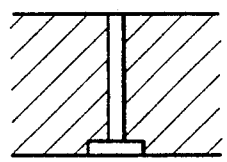
JUST FUSED
FIG. 6B
(PRIOR ART)
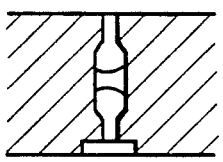
CIRCUIT-BROKEN
FIG. 6C
(PRIOR ART)
FIG. 7A (PRIOR ART)
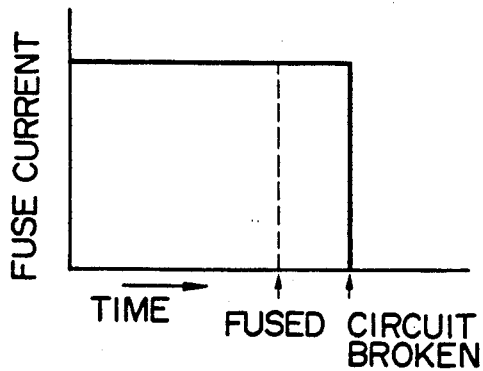
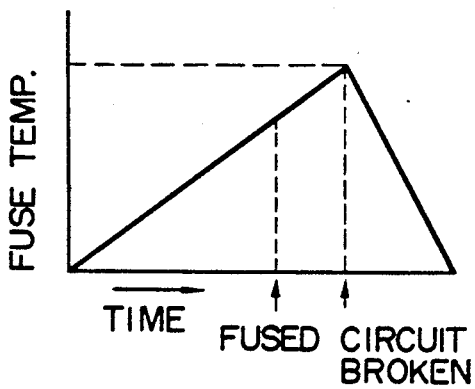
FIG. 7B (PRIOR ART)
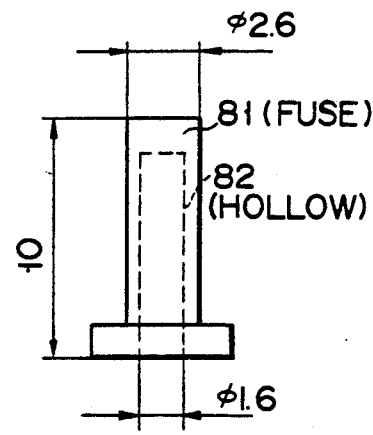
FIG. 8

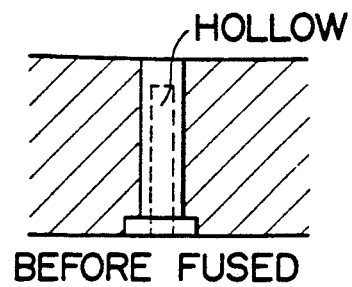
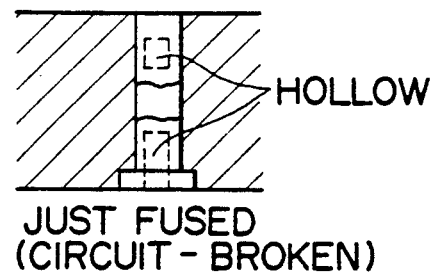
FIG. 9A  
BEFORE FUSED
FIG. 9B  
JUST FUSED (CIRCUIT-BROKEN)
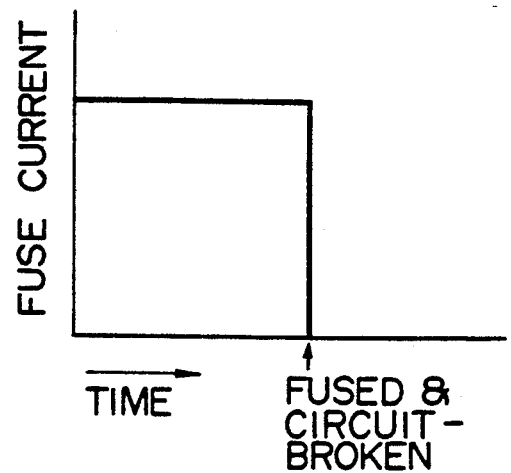
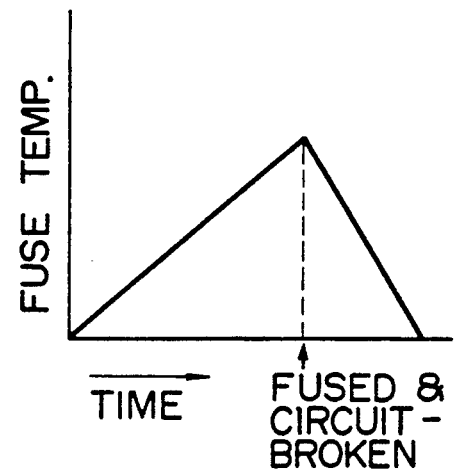
FIG. 10A
FIG. 10B
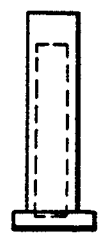
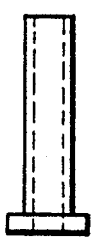
FIG. 11A
FIG. 11B
FIG. 11C

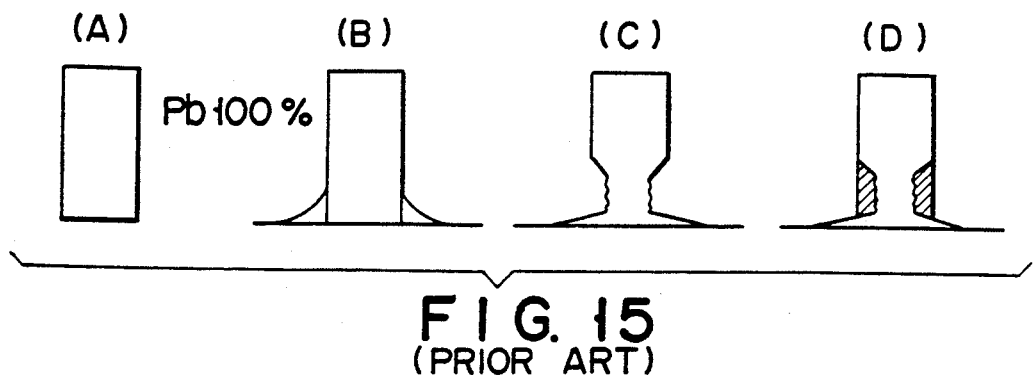
FIG. 15
(PRIOR ART)
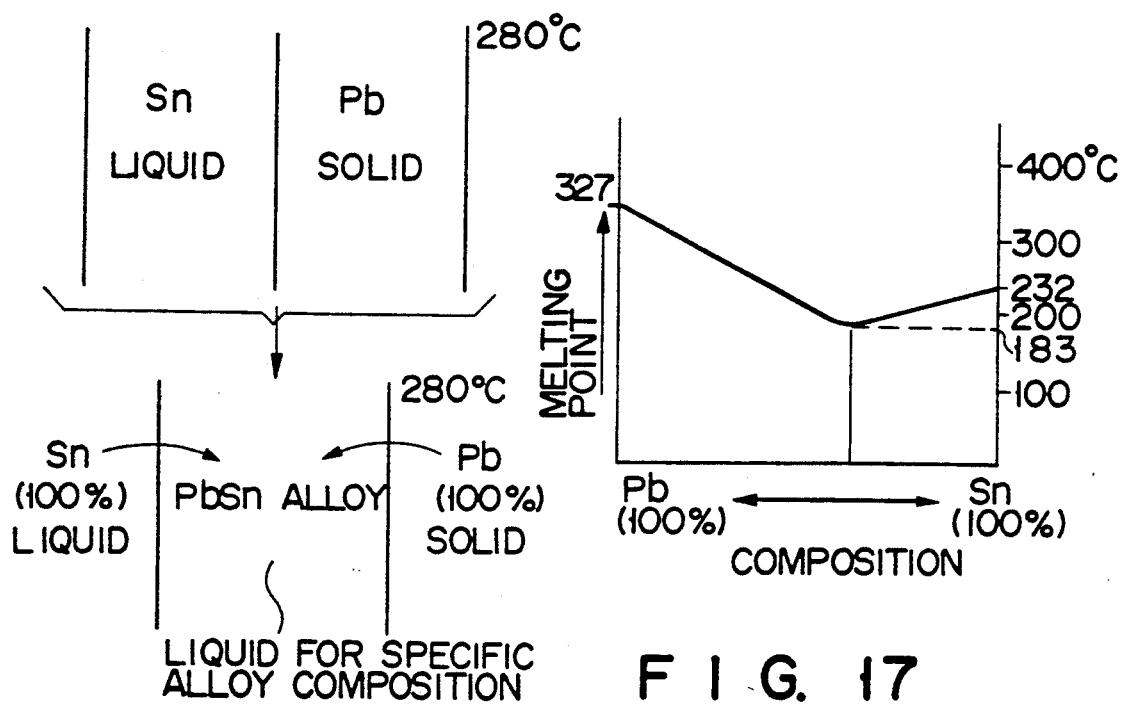
FIG. 16
(PRIOR ART)
FIG. 17
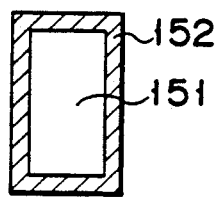
FIG. 18A
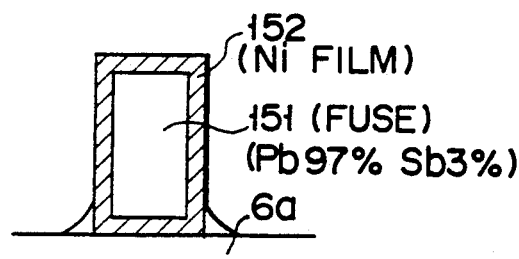
FIG. 18B

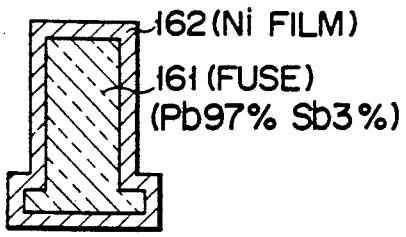
F I G. 19A
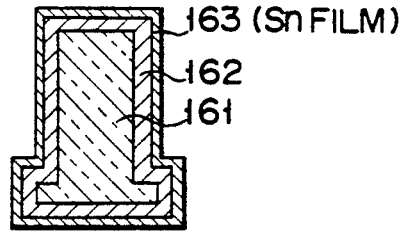
F I G. 19B
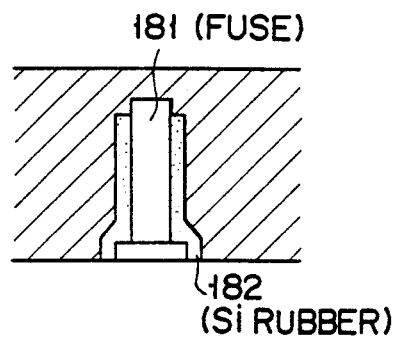
F I G. 21
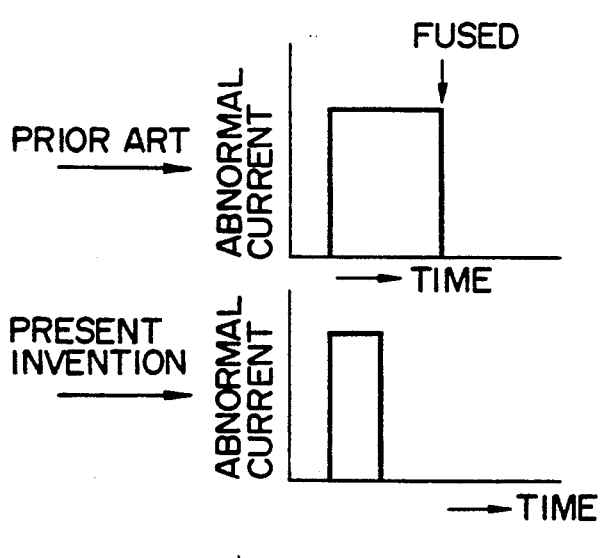
F I G. 22A
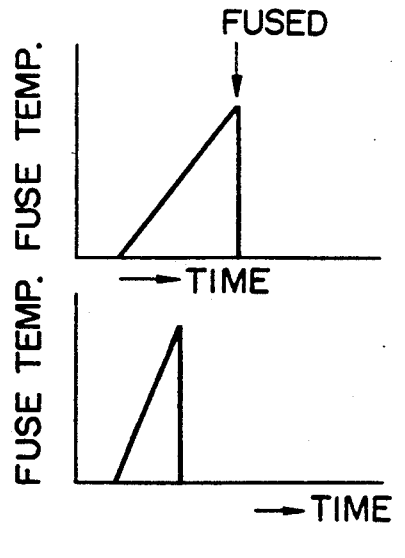
F I G. 22B

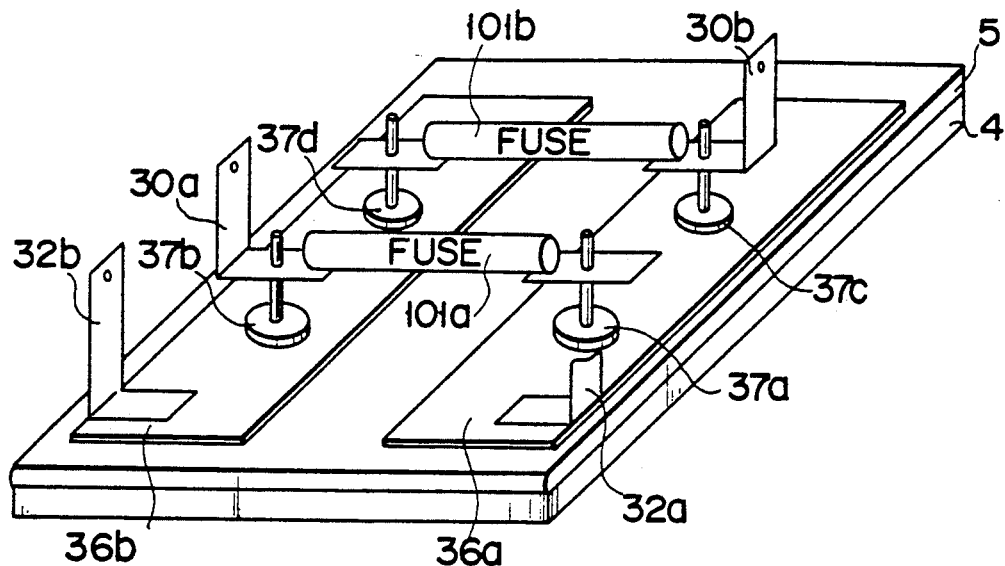
F I G. 31A
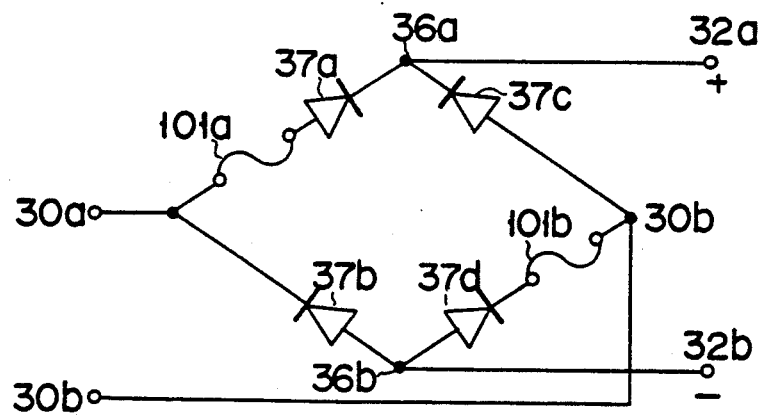
F I G. 31B

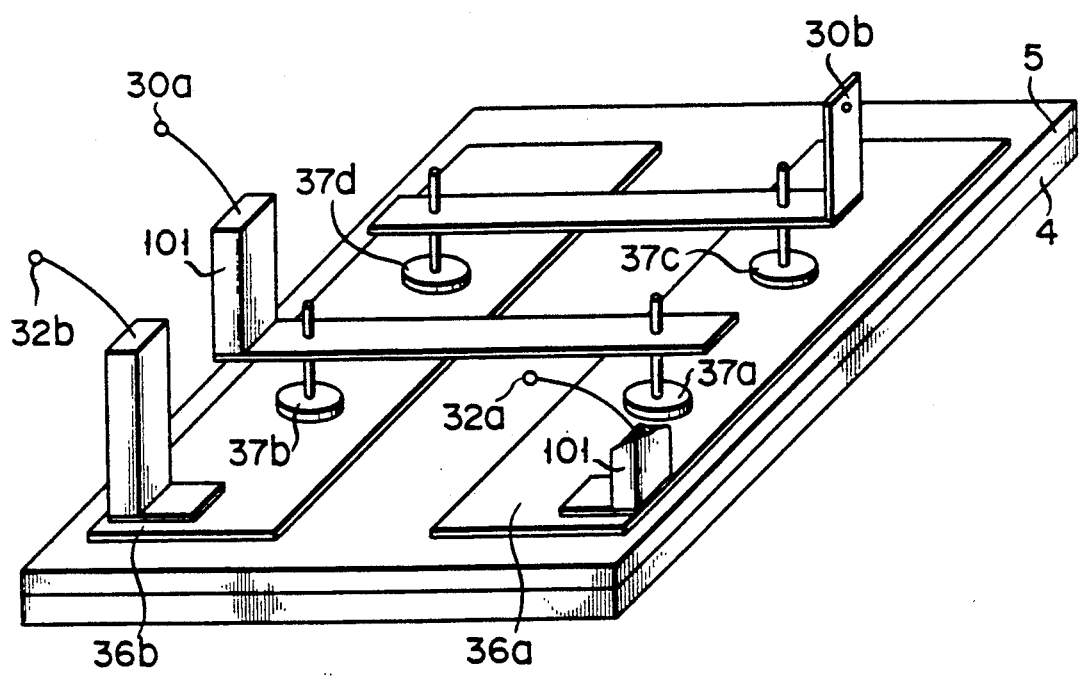
F I G. 35

SEMICONDUCTOR DEVICE WITH FUSE FUNCTION

This is a continuation of application Ser. No. 07/166,002, filed Mar. 9, 1988, U.S. Pat. No. 4,943,842.

BACKGROUND OF THE INVENTION

1. Field of the Invention

This invention relates to a semiconductor device having semiconductor elements and at least one fuse sealed by means of resin or in an airtight fashion, and more particularly, to a power semiconductor device in which the main current in the semiconductor element is large and which necessitates a reliable fuse function.

2. Description of the Related Art

A three phase full-wave semiconductor rectifier device [Japanese Patent Disclosure (Kokai) No. 61-77353], which is used in cars and has six semiconductor rectifier elements integrally sealed by means of resin, is an example of the prior art semiconductor device having no fuse function, and is explained with reference to the accompanying drawings.

As is shown in FIG. 28, insulation layer 5 is formed on radiation plate 4, with conductive patterns 6a and 6b being respectively formed on layer 5 and plate 4. Disk portions of diode 7 are soldered on conductive patterns 6a and 6b. Casing 11 is bonded on radiation plate 4, so as to surround diode 7, input terminal 10, and B+ terminal 9. Further, epoxy resin 15 fills casing 11 as well as the space which is provided inside the terminal holder (12) and over the casing (11).

FIG. 29 is a circuit diagram of a three phase fullwave rectifier device, the device being represented by a portion surrounded by broken lines; 7a to 7f denotes diodes; 9a and 9b, external output terminals; 10a to 10c, internal input terminals; and 8, a capacitor. In addition 14 indicates a stator coil of the three phase A.C. generator; and 16, a battery.

When diodes 7a and 7b; 7c and 7d; or 7e and 7f of the above-described prior art semiconductor rectifier device having no fuse function are simultaneously deteriorated to lose the rectifier function and set in the short-circuited condition due to an external effect such as an overvoltage, overcurrent, or mechanical shock applied to the device, or as a result of to an internal effect such as deterioration of the element, then an abnormal current will flow in the device, and generating an excessive heat.

A rectifier as disclosed in Japanese Utility Model Publication No. 60-23985 will now be described as a second example of the prior art semiconductor device, in this case, one having the fuse function.

As is shown in FIG. 30, rectifier terminal 22 and connection terminal 23 are arranged a specified distance apart from each other in resin casing 21. Silicon diode chip 24 is soldered on the end portion of rectifier terminal 22, and fuse wire 25 is bonded between silicon diode chip 24 and connection terminal 23, to constitute a current path, and the casing is filled with resin 26. Thus, fuse wire 25 is contained in the rectifier, and, when an overcurrent flows therethrough, is blown so as to protect the rectifier and other associated parts.

Since a rectifier having the fuse function uses a fuse wire as a fuse element and the fuse wire is buried in the epoxy resin, it will be difficult to attain a reliable fuse characteristic. More specifically, when an abnormal current flows, causing the fuse to blow, the epoxy resin changes in quality (it often becomes carbonized). As a result, a leak current can flow, via the quality-changed layer, and the fuse function cannot be sufficiently effected even if the fuse is blown out. In addition, that portion of the fuse wire which lies near the bonding portion of the fuse wire and the terminal may be easily subject to variation in thickness at the time of bonding, thus causing the value of a blowout current to be changed. Since the material used at the bonding portion is a fuse, the bonding strength becomes weak. Further, it is difficult to simply apply the fuse structure of the rectifier to an ordinary semiconductor device.

As described above, in a semiconductor device having no fuse function, an abnormal current can flow and abnormally high heat will be generated in the device or in the peripheral circuits, due to possible abnormal effect. In particular, in a module formed in a package or a semiconductor device dealing with a relatively large current, it is important to provide the fuse function in the device.

The fuse function is provided in a circuit (device or the associated circuit) so that the circuit is protected from damage by blowing out the fuse by Joule heat generated therein, when a current larger than a preset value flows in the fuse for a predetermined time.

In the prior art semiconductor device having the fuse function, a simple fuse wire is used, and it is difficult to always attain a reliable fuse function as will be described later. For example, it is difficult to always attain a constant blowout current, a constant time from the starting of the flow of abnormal current to the blowing-out of the fuse, a perfect blowout without causing leak current, and the like.

SUMMARY OF THE INVENTION

An object of this invention is to provide a semiconductor device which implements a fuse function to a semiconductor device having no fuse function, so that a possibility of abnormal heat generation due to an abnormal effect can be reduced, and heat generation, causing a temperature to be higher than a preset temperature, can be prevented, and which has an improved fuse function obtained by solving the problems described with reference to the fuse function of the prior art semiconductor device.

This invention comprises three inventions.

A semiconductor device of the first main invention includes a radiation plate of good head conductivity; a first electrically conductive pattern (an electrically conductive film or plate of a predetermined shape) and a second electrically conductive pattern which are formed on one surface of radiation plate and insulated from each other; a first semiconductor rectifier element (diode, thyristor or the like) fixed on the first electrically conductive pattern and having one electrode connected to the first electrically conductive pattern; a second semiconductor rectifier element fixed on the second electrically conductive pattern and having one electrode connected to the second electrically conductive pattern; an electrically conductive member having hollow fuse or electrically conductive member connecting the other electrodes of the first and second rectifier elements to each other; a first external terminal having a hollow fuse or a first external terminal electrically connected to the first electrically conductive pattern; a second external terminal fixed on and electrically connected to the second pattern; a third external terminal having a hollow fuse or a third external terminal fixed on and electrically connected to the electrically conductive member; and a casing for sealing the rectifier with part of the first, second and third external terminals exposed, and functions to pass a current via the first, second and third external terminals.

In the invention, the fusible body of the fuse is denoted simply by a fuse, and the hollow fuse is used to indicate a hollow fuse having no openings at both ends as shown in FIG. 11, or a fuse having an opening at least one end.

With the construction described above, the semiconductor device can have the function of a rectifier circuit, inverter circuit or the like, for example, in the case where a pair or a plurality of pairs of series-connected semiconductor rectifier elements are formed by connecting an electrode (for example, cathode electrode) of one polarity of the first semiconductor rectifier element to the first electrically conductive pattern, by connecting an electrode (for example, anode electrode) of the other polarity of the second semiconductor rectifier element to the second conductive pattern, and by connecting the anode electrode of the first semiconductor rectifier element to the cathode of the second semiconductor rectifier element by means of the conductive member.

In this type of semiconductor device, a large current can easily flow into the conductive member, connecting the external terminal to the first and second rectifier elements, when abnormal effect occurs as described before. Therefore, an inadvertent event such as abnormal heat generation will occur in the device and associated external circuits.

The semiconductor device of this invention includes the conductive member, or first or third external terminal, having a reliable fuse function, in order to prevent an accident such as abnormal heat generation.

In the first main invention, a hollow fuse is used to attain the reliable fuse function. The mechanical strength of a hollow fuse is enhanced in comparison with a solid fuse having the same cross-sectional area or the same blowout current, and thus it is less likely to deform in the assembling process. In the case where resin is molded to enclose the fuse, the hollow portion of the fuse serves as a space for blowout, and the fuse can be blown out immediately after it melts. Thus, the fuse can be correctly blown out by a predetermined blowout current within the preset blowout time, without significant variation.

The fuse can be mounted on an electrically conductive member such as a conductive pattern by a soldering or bonding process. In this case, it is preferable to form a thin metal film of a single- or multi-layered structure on the fuse by a plating or vapor-deposition method as shown in FIGS. 12A or 12B.

In the case where the fuse is soldered on the conductive member, a metal component of the fuse melts into the melted solder, or the fuse metal is partly eaten by the solder, causing the shape of the fuse to be changed so that the blowout current is largely changed. This can be prevented by coating the fuse with a thin metal film such as Ni film (which does not constitute a low-melting alloy with the metal component of the fuse and the soldering material), so that melted solder will not be in direct contact with the fuse.

In the case where the fuse is to be mounted on a conductive member by calking, if the surface of the fuse is oxidized, a bad electrical contact will be caused between the fuse and the member. Such a bad contact can be prevented by coating the surface of the fuse with an oxidation resistant metal such as Au.

It is also preferable to coat silicone rubber on the fuse. In general, a heat-shrinkable tube of silicone rubber can be used to coat the fuse. When the coated fuse is heated, the tube shrinks and is made in close contact with the fuse as shown in FIG. 13. This prevents formation of droop of the fuse and reduces variation in resistance at the end portion of the fuse.

In the case where epoxy resin is used as molding material to enclose the silicone rubber coated fuse, since silicone rubber has a heat conductivity smaller than epoxy resin, it is possible to reduce the rate of transmission of heat generated from the fuse to the epoxy resin. Then, rapid temperature rise in the fuse due to the blowout current can be attained to reduce the time required for blowing out. Further, silicone rubber is highly heat-resistant and it is not subjected to change in quality (e.g., carbonization). Then, a leakage current can be reduced to a negligible value, thus achieving a more reliable fuse function.

In the second main invention, the fuse contained in the device includes a solid fuse which is coated with a thin metal film of a single- or multi-layered structure as shown in FIG. 19, for example. The second main invention can have substantially the same effect and operation of the first main invention shown in FIG. 12.

In the third main invention, the fuse contained in the device includes a solid fuse whose side surface is coated with silicone rubber as shown in FIG. 27, for example. The third main invention can also have substantially the same effect and operation of the first main invention shown in FIG. 13.

The second and third main inventions have been made in the process of achieving the first main invention, and the object of each main invention is to provide a semiconductor device having a reliable fuse function in which the blowout current and blowout time are stable. The inventions are made to achieve various design modifications by using a compound fuse structure which is formed of a combination of the prior art fuse and a new element such as a hollow portion, plated film, resin film or the like, thus solving the various problems of prior art.

BRIEF DESCRIPTION OF THE DRAWINGS

FIG. 1 is a perspective view of a semiconductor device according to one embodiment of this invention;

FIG. 2 is a perspective view of the semiconductor device of FIG. 1 with the outside portion removed;

FIG. 3 is a cross sectional view taken along lines III—III in FIG. 1;

FIG. 4 shows a B+ terminal of a prior art device;

FIG. 5 shows a B+ terminal having the fuse function obtained by adding a desired blowout characteristic to the B+ terminal of FIG. 4;

FIGS. 6A–6C are model diagrams each showing the behavior of blowout of the fuse shown in FIG. 5;

FIGS. 7A and 7B show the relation between the fuse current and time, and that between the fuse temperature and time, at the time of blowout of the fuse of FIG. 5;

FIG. 8 shows the configuration of a fuse according to another embodiment of this invention;

FIGS. 9A and 9B are model diagrams each showing the behavior of blowout of the fuse shown in FIG. 8;

FIGS. 10A and 10B schematically show the relation between the fuse current and time, and that between the fuse temperature and time, at the time of blowout of the fuse of FIG. 8;

FIGS. 11A-11C show hollow fuses according to another embodiment of this invention;

FIGS. 15A-15D are diagrams each showing a prior art fuse, and explaining one of the problems thereof;

FIG. 16 is a diagram illustrating the cause of the problem shown in FIG. 15;

FIG. 17 shows the relation between the melting point and the composite ratio of Pb-Sn;

FIGS. 18A, 18B and 19A, 19B are cross sectional views of fuses according to other embodiments of this invention;

FIG. 21 shows a fuse according to another embodiment of this invention;

FIGS. 22A and 22B show the relation between an abnormal current and time, and that between the fuse temperature and time, each in the prior art case and in this invention;

FIGS. 31A and 31B respectively show perspective view and electrical circuit diagram of a semiconductor device according to another embodiment of this invention;

FIG. 35 is a modification of the embodiment shown in FIG. 31A, wherein part of the external terminal is formed by the fuse (101) of the present invention.

DETAILED DESCRIPTION OF THE PREFERRED EMBODIMENTS

Figure 12A:
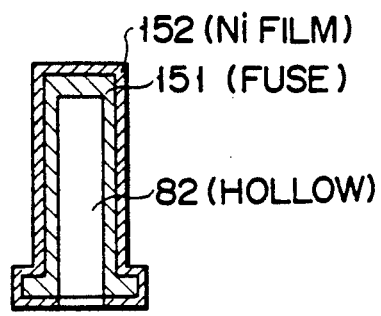
FIGS. 12A and 12B are cross sectional views of fuses according to still another embodiment of this invention.

There will now be described a semiconductor device according to one embodiment of this invention with reference to FIGS. 1 to 3.

FIG. 1 is a perspective view showing a three phase full-wave rectifier device according to this invention. FIG. 2 is a perspective view of the device from which an outer casing and resin filled in the outer casing are removed. FIG. 3 is a cross sectional view of the device of FIG. 1 taken along lines III—III.

In FIGS. 1 to 3, reference numeral 4 denotes a radiation plate of aluminum. After it is subjected to sandplastering process, a pattern of thin insulation layer 5 is selectively formed on radiation plate 4 by flame spraying, vapor deposition, sputtering, pattern pasting, or the like. First electrically conductive pattern 6a is formed on insulation layer 5 which is fixed on radiation plate 4 and second electrically conductive pattern 6b and electrically conductive pattern 6c are directly formed on radiation plate 4 by flame spraying, vapor deposition, sputtering, pattern pasting, or the like. First and second conductive patterns 6a and 6b are isolated from each other by means of insulation layer 5.

The cathode electrodes of diodes 7a, 7c, and 7e, functioning as the first semiconductor rectifier elements, are fixed on the first conductive pattern, and the anode electrodes of diodes 7b, 7d, and 7f, functioning as the second semiconductor rectifier elements, are fixed on the second conductive pattern by soldering, for example.

Opposite electrodes of a corresponding pair of the first and second semiconductor rectifier elements, for example, the anode of diode 7a and the cathode electrode of diode 7b, are connected to each other, via L-shape conductive member 10, by soldering or the like. Likewise, the anode electrode of diode 7c and the cathode electrode of diode 7d are connected to each other, and the anode electrode of diode 7e and the cathode electrode of diode 7f are connected to each other so as to form bridge circuit, as is shown by a circuit diagram in FIG. 14.

One end of rod-like fuse 101 and ground terminal 18 are respectively mounted on first conductive pattern 6a and conductive pattern 6c which is connected to the second conductive pattern by soldering or the like. Casing 11 of aluminum is fixedly mounted on radiation plate 4 to surround the aforementioned members, and terminal holder 12 is fixed on the upper surface of casing 11. (Incidentally, terminal 18 may be completely enclosed within casing 11 and holder 12.)

The terminal holder has box-like terminal cover 12a formed to laterally extend and have an opening at an extended end. First external terminal 12b (output terminal in this example) is formed to laterally extend inside terminal cover 12a, and first external terminal 12b is mounted on the other end of fuse 101, via output extraction member 12c.

The space in casing 11 and that in terminal holder 12 which continues to the space in casing 11 are filled with epoxy resin 15.

Figure 14:
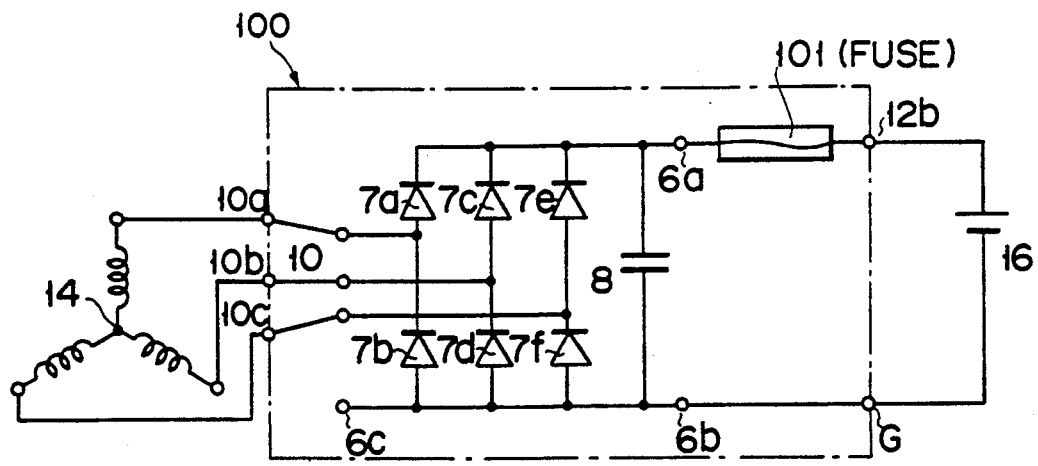
FIG. 14 is an electric circuit diagram of a semiconductor device according to an embodiment of this invention.
Figure 28:
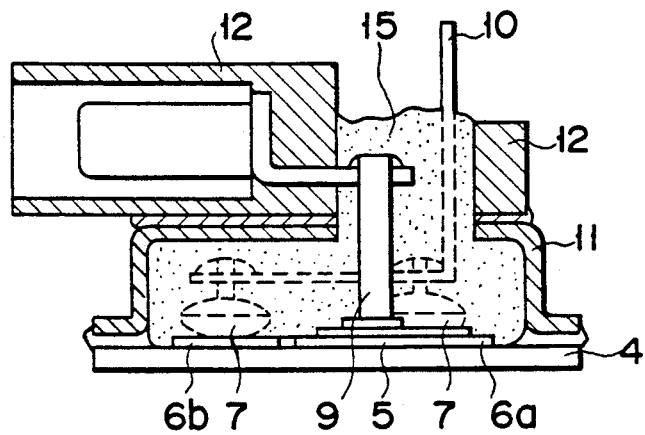
FIG. 28 is a cross sectional view of the prior art fuse having no fuse function.
Figure 29:
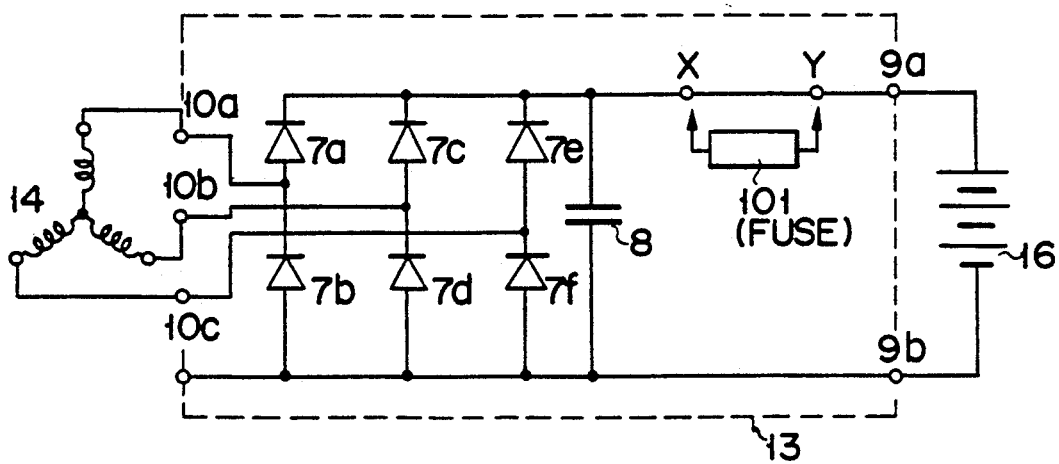
FIG. 29 is an electrical circuit diagram of the prior art semiconductor device.
Figure 30:
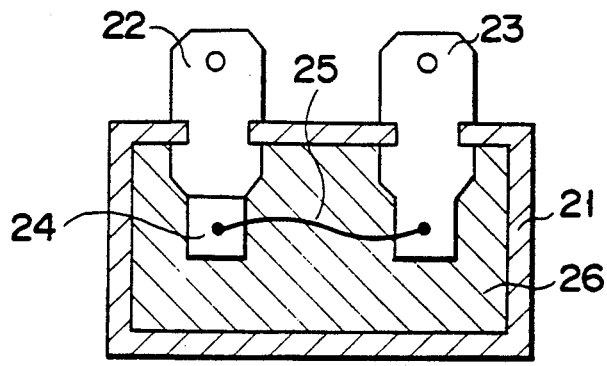
FIG. 30 is a cross sectional view of the prior art fuse having the fuse function.

Semiconductor device 100 of this invention uses fuse 101 having reliable fuse function, instead of using rivet-like copper B+ terminal 9 of the rectifier device shown in FIG. 28 which has no fuse function. The electrical circuit diagram of the rectifier device is shown in FIG. 14.

The upper end of conductive member 10 protrudes from the outer casing to form third (input) external terminals 10a, 10b, and 10c which are connected to stator coil 14 of the A.C. generator. Further, battery 16 is connected between first external terminal 12b and radiation plate 4 (corresponding to second external terminal), via ground terminal G, thus making the semiconductor device function as a three phase full-wave rectifier device for cars, for example.

Now, a semiconductor device according to another embodiment of this invention is explained with reference to the drawings. FIG. 31A is a perspective view of a single phase full-wave rectifier in which the outer casing and filled resin are omitted from the illustration. FIG. 31B is a circuit diagram thereof in which the same reference numerals as those in FIG. 31A are used to denote corresponding portions.

In this example, insulation layer 5 is formed on radiation plate (metal or resin) with good heat conductivity, and first and second electrically conductive patterns 36a and 36b are separately formed on insulation layer 5. The cathode electrodes of first rectifier elements (diodes) 37a and 37d are fixedly formed on and connected to first conductive pattern 36a, and the anode electrodes of second rectifier elements (diodes) 37b and 37d are fixedly formed on and connected to second conductive pattern 36b.

The anode electrodes of diodes 37a and 37c are electrically connected to the cathode electrodes of diodes 37b and 37d, respectively, via conductive members such as hollow fuses 101a and 101b, by soldering or solderless manner.

Third external terminals 30a and 30b are input terminals between which a single phase A.C. voltage is applied. First and second external terminals 32a and 32b are directly (without fuse) connected to the first and second conductive patterns, and a D.C. voltage obtained by full-wave rectification is generated between the output terminals (first output terminal 32a is used as a positive terminal).

Fuses 101a and 101b of this invention are blown out by an abnormally large current with a high reliability to protect an external device connected to the input or output side.

Figure 12B:
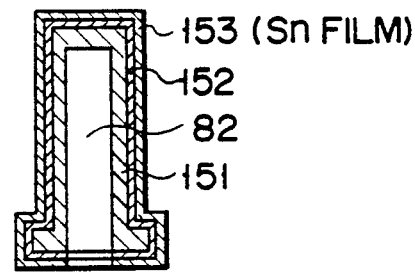
Figure 13:
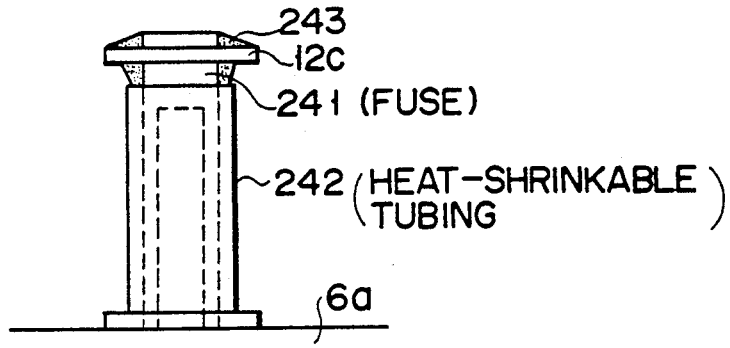
FIG. 13 shows a fuse according to yet another embodiment of this invention.

Incidentally, as is shown in FIG. 35, part of each of external terminals 30a and 32a may be constituted by fuse 101 which can be replaced with fuse 81 in FIG. 8, fuse 151 in FIG. 12, fuse 241 in FIG. 13, fuse 161 in FIG. 19, or fuse 181 in FIG. 21.

Figure 32:
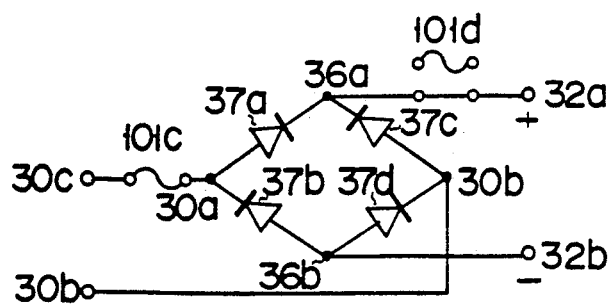
FIGS. 32 and 33 are circuit diagrams showing examples of application of the semiconductor device shown in FIG. 31.

FIG. 32 is a circuit diagram showing a single phase full-wave rectifier device according to another embodiment of this invention. In FIG. 32, the same reference numerals as in FIG. 31A are used to denote corresponding portions.

In this embodiment, first and second diodes 37a and 37b are connected to each other by means of conductive member 30a having no fuse, and third external terminal 30c which is formed to include fuse 101c of this invention is fixed on and connected to conductive member 30a. Further, first and second diodes 37c and 37d are connected to each other by means of a conductive member having no fuse, and third external terminal 30b is fixed on and connected to conductive member 30b.

Third external terminals 30c and 30b constitute input terminals. First external terminal 32a has no fuse, and constitutes output terminals in cooperation with second external terminal 32b. However, terminal 32a can be provided with fuse 101d, as the case may be.

The above embodiment functions to prevent an external device (not shown in FIG. 32) connected to the input side from being damaged at the time of malfunction of the diodes. In order to protect an external device connected to the output side, fuse 101d of this invention may be connected between output terminal 32a and first conductive pattern 36a. Further, in order to protect both external devices, two fuses 101c and 101d may be connected to the input and output sides.

Figure 33:
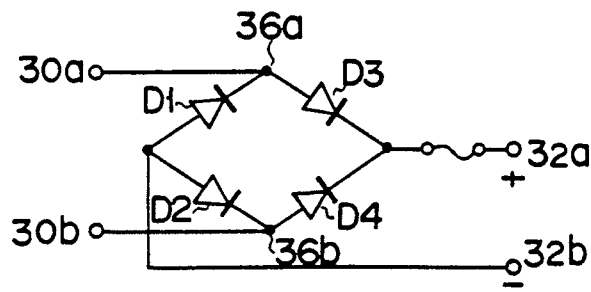

In the embodiments described above, the electrodes of the diodes fixed on and connected to one conductive pattern are of the same polarity. For example, in the semiconductor device of FIG. 31, the cathode electrodes of diodes 37a and 37c are connected to the first conductive pattern, but one of the cathode electrodes can be changed to the anode electrode. This embodiment can be attained as shown in FIG. 33 in which the cathode electrode of diode D1 and the anode electrode of diode D3 are fixed on and connected to first conductive pattern 36a, and the cathode electrode of diode D2 and the anode electrode of diode D4 are fixed on and connected to second conductive pattern 36b. First and second external terminals 32a and 32b constitute input terminals and third external terminals 30d and 30e constitute output terminals. This embodiment is effective when it is used with one of the input terminals grounded.

In the single phase full-wave rectifier circuit, when it is used wherein one of the two input terminals is circuit-grounded, a circuit of FIG. 33 can be used, for example. In this case, the second conductive pattern is formed on the radiation fin (in the case of functioning as a ground conductor) and thus the second external terminal (input) and radiation fin are commonly used. Further, when it is used wherein one of the two output terminals is circuit-grounded, a circuit of FIGS. 31 or 32 can be used, for example. In this case, the second external terminal (output) and radiation fin are commonly used.

Figure 34A:
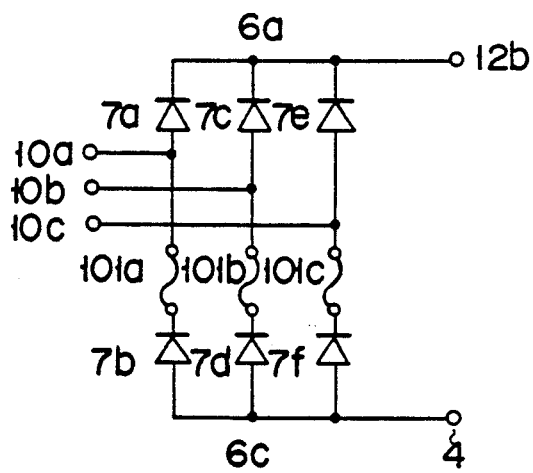
FIGS. 34A and 34B are circuit diagrams to which the semiconductor device shown in FIG. 1 can be applied.
Figure 34B:
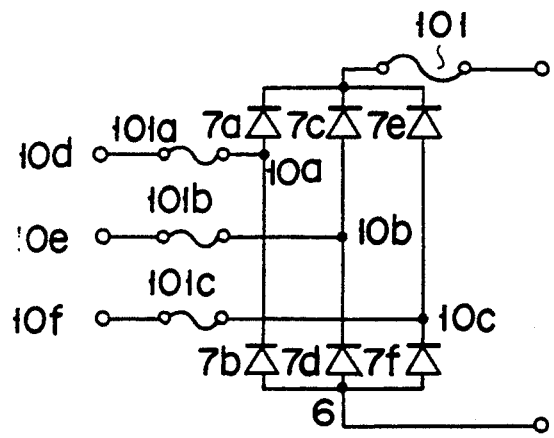

FIG. 34A shows an example obtained by modifying the single phase full-wave rectifier device of FIG. 31 to a three phase full-wave rectifier device. In practice, a circuit shown in FIG. 14 or FIG. 34B is used.

The embodiments containing fuse 101 of the first main invention are explained in more detail together with the process of completing this invention.

A fuse in the first main invention is a hollow fuse. B+ terminal 9 of the prior art rectifier device uses a Cu rivet as shown in FIG. 4. If it is formed of fuse material (Pb: 97%, Sb: 3%) so as to simply attain the fuse function or to constitute a fuse which can be blown out with a predetermined current, it becomes extremely thin as shown in FIG. 5, making it mechanically weak and difficult to handle. Assume that the fuse is enclosed by molding material of resin. In this case, when an abnormal current flows in the fuse and the temperature thereof starts to rise, the resin around the fuse is deformed by head according to the states set up immediately before the melting of the fuse (FIG. 6A), immediately after the melting of the fuse (FIG. 6B), and at the time of fuse blowout (c) as shown in FIG. 6. The deformation of the resin due to heat is necessary to permit the fuse metal to be mechanically separated when it melts as shown in FIG. 6C.

FIGS. 7A and 7B show the relation between a current flowing at the time of blowout and time, and that between the fuse temperature and time. It is seen that even if the fuse melts, the electrical conductivity is retained through the liquid-form fuse, and thus the fuse is not immediately blown out.

The fuse of this invention is rivet-form fuse 81 having hollow portion 82 which is opened at one end as shown in FIG. 8, for example. This fuse, formed of Pb alloy including Pb 97% and Sb 3%, is mechanically strong, and has a characteristic of minimum blowout current of 133 A at an ambient temperature of 20° C.

In the case where the fuse is molded by resin, the fuse can be blown out immediately after melting at the time of blowout, as is shown in FIG. 9, because of the presence of the hollow portion. FIGS. 10A and 10B show the relation between a current flowing at the time of blowout and time, and that between the fuse temperature and time. It also has an advantage that the fuse having the same external form can be formed to control the blowout current by changing the diameter of the hollow portion.

FIG. 11 shows an embodiment of the hollow fuse When the fuse is formed to have both ends closed as is shown in FIG. 11A, the manufacturing process may be complicated, and when it is formed to have both ends opened as shown in FIG. 11C, there is a certain possibility that the hollow portion is filled with the resin at the time of resin molding. Therefore, it is most preferable to form the fuse as shown in FIG. 11B wherein only one end of the hollow fuse is closed.

There will now be described the second main invention and the case where the fuse of the first main invention is coated with a single- or multi-layered thin metal film by plating, vapor deposition, or the like.

When a fuse (Pb: 100%) as shown in FIG. 15A is mounted on the conductive pattern by use of soldering material (Sn: 100%), it is not soldered as shown in FIG. 15B, but soldered as shown in FIG. 15C, and hatched portion in FIG. 15D melts into the soldering material (Sn: 100%).

For example, when the fuse (Pb: 100%) is soldered by use of soldering material (Sn: 100%) at a temperature of 280° C., Sn (100%) liquid and Pb (100%) solid are brought into contact with each other as shown in FIG. 16, and an alloy of Pb and Sn is formed at the contact portion. The melting point of the alloy of Pb and Sn falls below 280° C. depending on the composition of Pb and Sn, as is clearly seen from the phase diagram of Pb and Sn shown in FIG. 17. As a result, Pb of the fuse melts into the soldering material (Sn: 100%) and the fuse is deformed as shown in FIG. 15C (this is generally said that Pb of the fuse is eaten by Sn of the soldering material).

The blowout current of the fuse is basically determined by the resistance and cross sectional area of the fuse. The resistance of the fuse is determined by the material, cross sectional area and length thereof, and therefore, if the fuse is deformed as shown in FIG. 15C, a prescribed fuse characteristic cannot be obtained.

In this invention, fuse 151 is coated with thin metal film 152 of Ni as shown in FIGS. 12A or 18A to solve the problem that the fuse is eaten by the soldering material.

Fuses 151 and 161 shown in FIGS. 18B and 19B are formed of fuse material of Pb 97% and Sn 3%, and 152 and 162 denote thin metal films (several microns in thickness) of Ni formed by plating. When the fuse is mounted on conductive pattern 6a of Cu by use of soldering material of Sn 100%, Pb of fuse 151 is protected by thin metal film 152 of Ni and does not melt into Sn of the soldering material as shown in FIG. 18B.

The function of the thin metal film (152) formed on the outside surface of the fuse in this invention is to prevent the fuse (which is Pb, Pb alloy, Sn or Sn alloy in general) from melting into the soldering material (which is Pb-Sn alloy including Bi, Sb, Ag, Ca, Cu, Cd, Zn, In, or the like), thus keeping the fuse in its original form and attaining a reliable blowout characteristic.

In the case where a metal component of the thin metal film brought into contact with the fuse forms an alloy together with a metal component of the soldering material or fuse, it is preferable that the melting point of the alloy is set higher than that of the fuse. Ni, Co, Fe, Pt, Cu, or Al can be preferably used as the component of the thin metal film, or they can be used as that of a thin alloy film for coating the fuse.

However, in various cases, the fuse is soldered on the conductive member and it is sometimes required that the outermost surface of the thin metal film coated on the fuse have a good soldering property. In such a case, the thin metal film may be formed with a plurality of layers.

For example, Sn thin film 153 or 163, which is easily wet on the solder, is formed on Ni thin metal film 152 or 162, as is shown in FIGS. 12B or 19B. In the case where the thin metal film is formed by plating, a base metal film may be used, as required.

Next, the third main invention and the case where silicone rubber is formed on the side surface of the fuse of the first main invention are explained. This fuse is particularly effective when resin is used for molding to enclose the fuse.

As shown in FIG. 6, it is necessary to deform the resin around the fuse in order to blow out the fuse after it starts to melt, and thus it takes a relatively long time.

In the case where epoxy resin is used as the filling resin, since the heat conductivity thereof is high, rise in the fuse temperature becomes slow when an abnormal current flows in the device. This makes the time for the fuse blowout longer and the temperature at the other portions may become extremely high.

Figure 20:
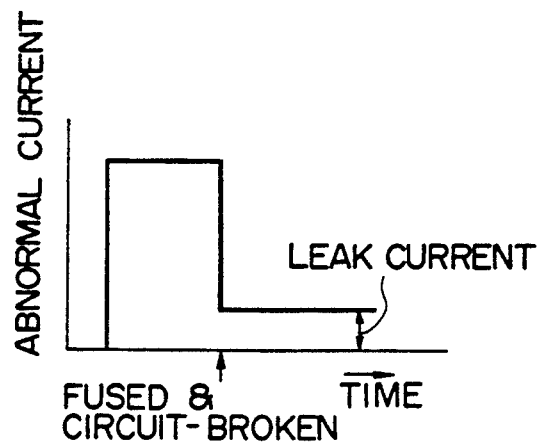
FIG. 20 illustrates a problem in the electrical characteristic of a prior art fuse.

Further, when the epoxy resin is used, the resin around the fuse will be deformed and change in quality as shown in FIG. 6C. At this time, the resin changes in quality (mainly carbonized) to be made conductive, and current may slightly flow even after the fuse blowout as shown in FIG. 20.

As described above, the fuse function is incomplete in that it takes a long time to blow out the fuse after an abnormal current starts to flow, and a leak current will flow after the fuse blowout. Such incomplete fuse function was significantly improved by directly coating silicone rubber 182 on the side surface of fuse 181 enclosed by epoxy resin, as is shown in FIG. 21.

The heat conductivity of silicone rubber (for example, $4.3 \times 10^{-4}$ cal/cm·s·°C.) is far lower (about 1/10) than that of epoxy (for example, $2.0 \times 10^{-3}$ cal/cm·s·°C.), and therefore the temperature of the fuse of this invention, coated with silicone rubber, rapidly rises. Further, silicone rubber is superior to epoxy resin in the heat-resistance, and even when it is deformed by heat and changes in quality as shown in FIG. 6C, the electrical characteristic such as insulation property thereof will not be so deteriorated as in epoxy resin. This provide a great advantage that a leakage current will not flow in the device after the fuse blowout.

FIGS. 22A and 22B show the relation between an abnormal current flowing in the device and time, and that between the fuse temperature and time, in the case of the prior art and in this invention.

Figure 23:
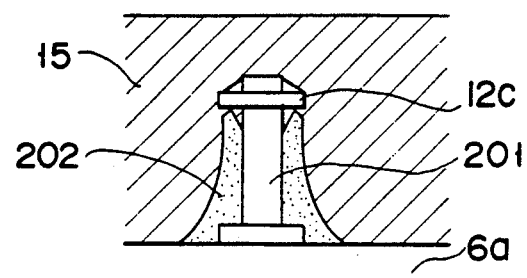
FIG. 23 shows a fuse according to another embodiment of this invention.

A method of coating silicone rubber on the fuse is effected by first soldering one end of fuse 201 to conductive pattern 6a and then soldering the other end to output extraction member 12c as shown in FIG. 23. After this, silicone rubber 202 is coated and thermally cured at a temperature of 150° C. for approx. 30 minutes, and then epoxy resin 15 is filled in and cured.

Figure 24A:
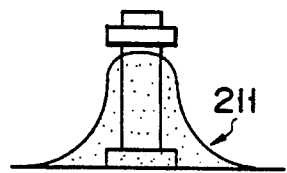
FIGS. 24A-24C are model diagrams each showing the problem occurring in the method used in the embodiment of FIG. 23.
Figure 24B:
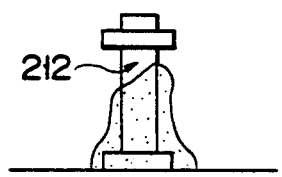
Figure 24C:
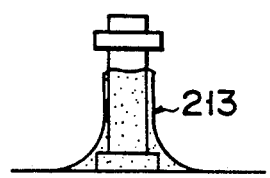
Figure 25:
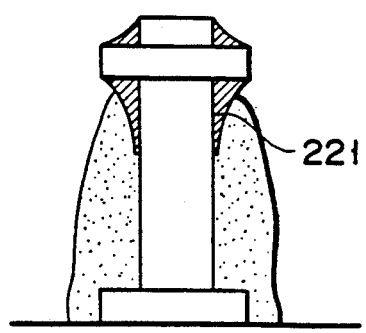
FIGS. 25 and 26 are model diagrams each showing other problems occurring in the method used in the embodiment of FIG. 23.

However, the method has the following problem. That is, since liquid-form silicone rubber is coated, it attaches to unwanted portion 211 as shown in FIG. 24A so that other functions may be affected. Further, silicone rubber may not be coated on such a portion as indicated by portion 212 in FIG. 24B and it may be coated with a thickness smaller than necessary on such a portion as indicated by portion 213 in FIG. 24C. It takes a long time to cure the silicone rubber after it is coated, making it troublesome to deal with the silicone rubber. Since silicone rubber is coated after the soldering process, solder droop 221 may be formed as shown in FIG. 25, affecting the fuse function.

Figure 26:
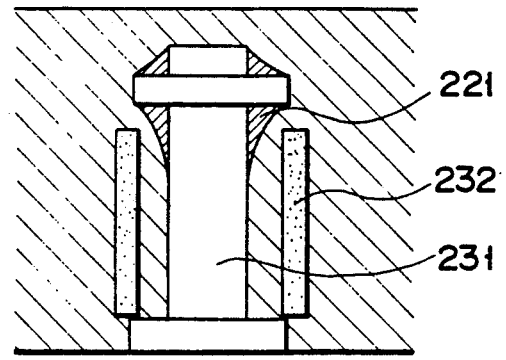

In another method, silicone rubber is coated and cured before the fuse is soldered. However, according to this method, the fuse surface will be stained by vapor generated in the curing process, deteriorating the soldering property. When an ordinary silicone tube (which is not heat-shrinkable) 232 is used to cover fuse 231, formation of solder droop 221 cannot be prevented as shown in FIG. 26. Further, when epoxy resin is used for molding, the resin will enter the space between the fuse and tube, affecting the fuse function.

Figure 27:
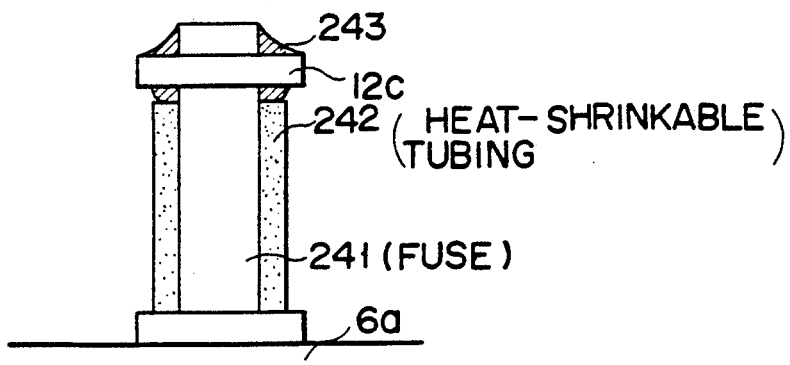
FIG. 27 is a diagram showing a fuse according to another embodiment of this invention, which solves the problems shown in FIGS. 24, 25, and 26.

The problems described above can be solved by use of a commercially-available heat-shrinkable tube of silicone rubber. The heat-shrinkable tube preferably has a property that it will not shrink in the lengthwise direction but shrink only in the radius direction. A film of desired uniform thickness can be closely formed on a desired portion of the fuse by making use of the property of the tube as shown in FIG. 27. Generally speaking, any tube can be used for coating the fuse, if the refractory property of the tube is better than that of epoxy resin, and if the electrical conductivity of the tube is sufficiently low even when it is deformed by heat.

That is, since the heat-shrinkable tube properly selected initially has a diameter larger than that of an ordinary tube, it is easy to set the tube to cover the fuse. After it has shrunk, since the diameter of the tube will become smaller than that of the fuse if it is set under the natural state, it attaches closely to the tube, making no space between the fuse and tube. The heat-shrinkable tube is not liquid but is solid in the initial state, and does not shrink in the lengthwise direction but shrinks uniformly in the radius direction. Therefore, it is possible to solve the problems that silicone rubber attaches to an unwanted portion, that it is not coated on a necessary portion, and that it is coated with an uneven thickness when liquid silicone rubber is coated, and thus it is easy to deal with the heat-shrinkable tube. Further, time for effecting the curing process at 150° C. is as short as approx. 1 minute.

When the heat-shrinkable tube is mounted, one end of fuse 241 is first fixed on conductive pattern 6a by means of solder (Sn: 100%), as is shown in FIG. 27. Then, silicone heat-shrinkable tube 242 with a desired length is set to cover the fuse, and set in an atmosphere of 150° C. for 1 minute, thus completing the curing process. After this, the upper end of the fuse is fixed on output extraction member 12c by means of solder 243. When it is cured before soldering, the soldering property will not be affected, preventing formation of the solder droop as shown in FIG. 27.

The semiconductor device of this invention is featured in the built-in fuse. It is possible to provide a semiconductor device which can always exhibit an excellent fuse function and prevent abnormal heat generation by any inadvertent cause. The property of the fuse according to the present invention is as follows:

(1) A hollow portion is provided in the fuse. This increases the mechanical strength of the fuse and makes it possible to easily control the blowout current without changing the outer diameter of the fuse. When resin is molded on the fuse, it is possible to blow out the fuse immediately after it starts to melt, reduce time for blowing out the fuse after an abnormal current has started to flow, and thus attain the reliable fuse function.

(2) A single- or multi-layered thin metal film is formed on the fuse. In this case, since the fuse is separated from the melted mounting solder by means of the thin metal film, the fuse will not melt into the solder when the fuse is mounted on the conductive member, thus preventing the fuse from being deformed at the mounting portion. Therefore, it is possible to attain the fuse property as designed.

(3) The side surface of the fuse is covered with silicone rubber by use of a heat-shrinkable tube. This causes the wettable area of the fuse to be limited at the time of soldering the fuse on the conductive member, and prevents formation of solder droop, providing a reliable fuse function. When the fuse is enclosed by resin molding, the temperature of the fuse rapidly rises, in comparison with the prior art case, after an abnormal current has started to flow, and time for blowing out the fuse can be shortened. Since silicone rubber is not deteriorated in its insulation property even if it has changed in quality, a current flowing after the blowout can be made far smaller than that obtained in a case where the fuse is surrounded by a carbonized epoxy resin, and such a current can be negligible, thus providing an excellent fuse characteristic.

It is possible to combine the above means (1) to (3) in order to solve various problems associated with the prior art fuse function which is attained by use of a simple fuse wire.

In each of the embodiments, it is possible to make the cross section of the fuse in the form of circle, ellipse, rectangle, hexagon, or the like.

Further, in the embodiment using the hollow fuse, it is possible to fill the hollow portion with liquidlike material such as silicone oil having a refractory property. When the hollow is filled, the mechanical strength of a thin tube-like fuse is greatly enhanced, thus making easy to handle it in a manufacturing process.

What is claimed is:

1. A semiconductor device comprising:
   a semiconductor element;
   a hollow fuse member soldered by a soldering material to the semiconductor element;
   means for enclosing the semiconductor element and the fuse member, said enclosing means being filled with a resin so that the semiconductor element and the fuse member are fixed in place; and
   a thin coating formed on the fuse member, said coating having a melting point higher than that of the soldering material.

2. A semiconductor device comprising:
   a radiation plate;
   first and second conductive patterns formed on one surface of said radiation plate, said first and second conductive patterns being electrically insulated from each other;
   a first semiconductor element, fixed on and connected to said first conductive pattern;
   a second semiconductor element, fixed on and connected to said second conductive pattern;

conductive means for connecting said first and second semiconductor elements to each other;
a first external terminal, electrically connected to said first conductive pattern;
a second external terminal, electrically connected to said second conductive pattern;
a third external terminal, electrically connected to said conductive means; and
an outer casing for enclosing said semiconductor element and said first to third external terminals, provided that part of each of said first to third external terminals is exposed to an exterior of the casing,
wherein at least one of said conductive means, first external terminal, second external terminal, and third external terminal includes a fuse coated with a thin metal film, said fuse being formed of Pb or a Pb alloy including at least one metal selected from the group consisting essentially of Bi, Ca, Cd, and Sb.

3. The semiconductor device of claim 2, wherein the thin metal film coated on the fuse is formed of metal selected from the group consisting essentially of Ni, Co, Pt, Al, and Cu, or being formed of an alloy containing mainly a metal selected from the group consisting essentially of Ni, Co, Pt, Al, and Cu.

4. A semiconductor device comprising:
a radiation plate;
first and second conductive patterns formed on one surface of said radiation plate, said first and second conductive patterns being electrically insulated from each other;
a first semiconductor element, fixed on and connected to said first conductive pattern;
a second semiconductor element, fixed on and connected to said second conductive pattern;
conductive means for connecting said first and second semiconductor elements to each other;
a first external terminal, electrically connected to said first conductive pattern;
a second external terminal, electrically connected to said second conductive pattern;
a third external terminal, electrically connected to said conductive means; and
an outer casing for enclosing said semiconductor element and said first to third external terminals, provided that part of each of said first to third external terminals is exposed to an exterior of the casing,
wherein at least one of said conductive means, first external terminal, second external terminal, and third external terminal includes a fuse coated with a thin metal film, said fuse being formed of Sn or an Sn alloy including at least one metal selected from the group consisting essentially of Bi, Ca, Cd, and Sb.

5. The semiconductor device of claim 4, wherein the thin metal film coated on the fuse is formed of metal selected from the group consisting essentially of Ni, Co, Pt, Al, and Cu, or being formed of an alloy containing mainly a metal selected from the group consisting essentially of Ni, Co, Pt, Al, and Cu.

6. A semiconductor device according to claims 2 or 4, wherein said thin metal film coated on said fuse is formed having a multi-layered structure and an outermost layer of said thin metal film is formed essentially of Sn.

* * * * *